United States Patent
Dhillon et al.

(10) Patent No.: US 6,451,491 B1
(45) Date of Patent: Sep. 17, 2002

(54) AQUEOUS DEVELOPABLE NEGATIVE ACTING PHOTOSENSITIVE COMPOSITION HAVING IMPROVED IMAGE CONTRAST

(75) Inventors: Major S. Dhillon, Belle Mead; Stanley F. Wanat, Scotch Plains; Gerhard Sprintschnik, Branchburg, all of NJ (US)

(73) Assignee: Agfa Corporation, Wilmington, MA (US)

( * ) Notice: Subject to any disclaimer, the term of this patent is extended or adjusted under 35 U.S.C. 154(b) by 0 days.

(21) Appl. No.: 09/688,471

(22) Filed: Oct. 16, 2000

Related U.S. Application Data

(63) Continuation of application No. 08/566,760, filed on Dec. 4, 1995, now abandoned.

(51) Int. Cl.⁷ .............................. G03F 7/021; G03F 7/30
(52) U.S. Cl. ........................ 430/18; 430/175; 430/302
(58) Field of Search ................................ 430/325, 302, 430/18, 175

(56) References Cited

U.S. PATENT DOCUMENTS

| | | | |
|---|---|---|---|
| 4,631,245 A | 12/1986 | Pawlowski | 430/175 |
| 4,652,604 A | 3/1987 | Walls et al. | 522/63 |
| 4,687,726 A | 8/1987 | Schlögl et al. | 430/175 |
| 4,868,091 A | 9/1989 | Boettcher et al. | 430/281 |
| 4,940,646 A | 7/1990 | Pawlowski | 430/175 |
| 5,045,429 A | 9/1991 | Mack et al. | 430/175 |
| 5,443,937 A | 8/1995 | Bodager et al. | 430/143 |

FOREIGN PATENT DOCUMENTS

| | | |
|---|---|---|
| EP | 0 152 819 | 8/1985 |
| EP | 0 519 591 A1 | 12/1992 |

*Primary Examiner*—John S. Chu
(74) *Attorney, Agent, or Firm*—Richard S. Roberts

(57) ABSTRACT

A color ant dispersion having a pigment, a solvent composition of a $C_1$–$C_8$ aliphatic alcohol, a mono- or di-$C_1$–$C_8$ alkylene glycol $C_1$–$C_8$ alkyl ether, or a cyclic ketone; and an aqueous alkaline soluble or swellable polymeric compound which is the reaction product of a hydroxy containing polymer and an anhydride in the presence of a catalytic amount of a tertiary amine catalyst. The pigment and the polymeric compound are present in a high relative weight ratio of from about 0.75:1.25 to about 1.25:0.75. An admixture of the dispersion, a light sensitive component diazonium compound or photopolymerizable composition and an aqueous alkaline soluble or swellable polymeric binder, when coated and dried onto a substrate, forms a photographic element, which when imagewise exposed and developed has an exceptionally high contrast between image and removed non-image areas.

16 Claims, No Drawings

AQUEOUS DEVELOPABLE NEGATIVE ACTING PHOTOSENSITIVE COMPOSITION HAVING IMPROVED IMAGE CONTRAST

CROSS-REFERENCE TO RELATED APPLICATION

This application is a continuation of co-pending U.S. patent application Ser. No. 08/566,766 filed Dec. 4, 1995.

BACKGROUND OF THE INVENTION

1. Field of the Invention

The present invention relates to improved colorant dispersions and to photosensitive compositions using such dispersions. More particularly to lithographic compositions which are aqueous developable, negative acting, and have improved image contrast.

2. Description of the Prior Art

It is known in the art to produce photosensitive compositions suitable for the production of printing plates and color proofing films. Lithographic printing plates generally are composed of an aluminum containing substrate which may or may not have been treated with a variety of processes recognized in the art including anodization, graining and hydrophilization. The prepared substrate may then be applied with a photosensitive coating comprising a photosensitizer, binding resins, colorants, acid stabilizers, surfactants and other art recognized components. Common photosensitizers include diazo compounds, including polymeric diazonium condensates salts and photopolymerizable compositions. Sensitizers, binders and printing plates employing aromatic diazonium compounds are described in U.S. Pat. Nos. 3,175,906; 3,046,118; 2,063,631; 2,667,415; 3,867,147 and 3,679,419 which are incorporated herein by reference.

In order to be useful, such photosensitive compositions must have a series of properties including good image contrast, developability with aqueous alkaline solutions, no redeposit of developed particles back onto image areas and good cleanout of nonimage areas by development. It must also have good printing runs, photosensitivity, ink receptivity, and oleophilicity of its a binding resins. U.S. Pat. No. 3,867,147 discloses photosensitive materials comprising a mixture of condensation products of diazonium salts and polymeric binders including polyvinyl acetals, such as polyvinyl formal or polyvinyl butyrals to produce printing plates. These photosensitive compositions have high photosensitivity and good oleophilicity and print runs but can only be properly processed by developers containing a large amount of volatile organic solvents. U.S. Pat. No. 4,387,151 discloses printing plates prepared from photosensitive mixtures of condensation products of diazonium salts and polymeric binders. These can be developed with aqueous, alkaline solutions without organic solvents, however, lithographic printing plates made from these compositions produce light hardened layers having unsatisfactory ink receptivity. Photosensitive compositions with polyvinyl acetal polymers are known from U.S. Pat. No. 4,413,091 and 4,085,079, however, these photosensitive elements must also be developed with developers which contain organic solvents. It is desirable to develop printing plates without the use of organic solvents since vapors and waste waters originating from these developers are disadvantageous. U.S. Pat. No. 4,631,245, which is incorporated herein by reference, teaches an anhydride modified polyvinyl acetal polymer which is most useful as a binder for photosensitive composition layers. They can be developed with neutral or weakly alkaline, aqueous solutions and produce printing plates with a high print run performance and good ink receptivity. These photosensitive mixtures yield image areas with good oleophilic properties, resistance to abrasion during printing and etching resistance. Unfortunately, these compositions only permit a relatively small amount of pigment to be incorporated into a pigment dispersion which is subsequently used to produce photographic elements. Hence the contrast between the developed image and the background substrate is exceedingly low. This is a disadvantage to the printer when trying to view the image. The present invention improves on the foregoing method of preparing pigment dispersions and photographic compositions used to produce photographic elements by using a solvent composition which allows a much higher pigment loading. Photographic elements thereby produced have a much greater image to substrate contrast and an image which is much easier to view. It has been found that the use of propylene lycol methyl ether (PGME) butyrolactone (BLO), tetrahydrofuran (THF), methyl cellosolve (MC) i.e., ethylene glycol monomethyl ether and methyl cellosolve acetate (MCA) produce stable pigment dispersions and photosensitive coating which allow the formation of a stable photosensitive coating with a high pigment loading.

The present invention provides a negative working photosensitive composition which is suitable for use in the production of photographic elements such as lithographic printing plates, and which has the aforesaid advantages of good photographic elements and additionally has an improved contrast between the image and the background substrate. The photosensitive composition can still be developed by means of practically solvent-free, neutral or alkaline aqueous solutions, and yields printing plates producing large print runs and having a good ink receptivity.

SUMMARY OF THE INVENTION

The invention provides a colorant dispersion which comprises in admixture
  (a) at least one pigment;
  (b) a solvent composition which comprises at least one of a $C_1$–$C_8$ aliphatic alcohol, a mono- or di-$C_1$–$C_8$ alkylene glycol $C_1$–$C_8$ alkyl ether, or a cyclic ketone; and
  (c) at least one aqueous alkaline soluble or swellable polymeric compound which is the reaction product of a hydroxy containing polymer and an anhydride in the presence of a catalytic amount of a tertiary amine catalyst;
wherein the pigment and the polymeric compound are present in a weight ratio of from about 0.75:1.25 to about 1.25:0.75 and wherein the solvent composition is present in an amount sufficient to form a uniform, stable dispersion.

The invention also provides a negative working photosensitive composition which comprises an admixture of at least one light sensitive component diazonium compound or photopolymerizable composition, in an amount sufficient to form a uniform photosensitive composition; at least one aqueous alkaline soluble or swellable polymeric binder compound which is the reaction product of a hydroxy containing polymer and an anhydride in the presence of a catalytic amount of a tertiary amine catalyst, which binder is present in an amount sufficient to bind the photosensitive composition in a uniform admixture; and the above dispersion in an amount sufficient to uniformly color the photosensitive composition.

The invention further provides an imagewise exposed and developed photographic element having high contrast between image and removed non-image areas which comprises (a) a substrate;

(b) a photographic image on the substrate, which image has been produced by coating and drying a photosensitive composition on the substrate, imagewise exposing the photosensitive composition to actinic radiation and removing the non-image areas of the photosensitive composition to thereby uncover portions of the substrate underlying the non-image areas while not removing the image areas; wherein the substrate under the removed non-image areas has a Hunter stimulus lightness value L ranging from about 35 to about 80, the image areas have an L value of from about 20 to about 60 and the difference between the L value for the substrate under the removed non-image areas and the L value for the image areas is at least about 15.

The invention also provides a method of producing an imagewise exposed and developed photographic element having high contrast between image and removed non-image areas which comprises i) forming the above colorant dispersion ii) forming a negative working photosensitive composition which comprises an admixture of at least one light sensitive component diazonium compound or photopolymerizable composition, in an amount sufficient to form a uniform photosensitive composition; at least one aqueous alkaline soluble or swellable polymeric binder compound which is the reaction product of a hydroxy containing polymer and an anhydride in the presence of a catalytic amount of a tertiary amine catalyst, which binder is present in an amount sufficient to bind the photosensitive composition in a uniform admixture; and the colorant dispersion in an amount sufficient to uniformly color the photosensitive composition;

iii) coating the photosensitive composition onto a substrate and drying;

iv) imagewise exposing the photosensitive composition to actinic radiation; and v) removing the nonimage areas of the photosensitive composition from the substrate while leaving the image areas of the photosensitive composition on the substrate;

wherein the substrate under the removed non-image areas has a Hunter stimulus lightness value L ranging ranging from about 35 to about 80, the image areas have an L value of from about 20 to about 60 and the difference between the L value for the substrate under the removed non-image areas and the L value for the image areas is at least about 15.

DETAILED DESCRIPTION OF THE PREFERRED EMBODIMENT

In the practice of the present invention, a pigment dispersion composition is prepared which is a uniform dispersion comprised of a pigment, a solvent composition and a polymeric compound.

The pigment component may be any pigment known in the art such as Permanent Carmine FBB-02 or Copper phthalocyanine (Blue B2G) among many others. It is preferably present in the dispersion composition in an amount of from about 2% to about 20% by weight of the composition. A more preferred range is from about 4% to about 10% and most preferably from about 5% to about 7%.

The composition then contains a polymeric component. The polymeric component according to the invention are produced by using a hydroxy containing polymer, preferably a synthetic polymer containing hydroxyl groups and having no further functional groups which are capable of reaction with acid anhydrides. Synthetic polymers containing hydroxy groups, which can be used include, in particular, polymers having vinyl alcohol units. Also useful are epoxy resins and saponified epoxy resins, copolymers of allyl alcohol or higher molecular weight unsaturated alcohols, polyhydroxyalkyl acrylates and polyhydroxyalkyl methacrylates and similar polymers. Suitable polymers containing vinyl alcohol units include partially saponified polyvinyl esters, polyvinyl acetals having free hydroxy groups and corresponding reaction products of copolymers with vinyl ester units or vinyl acetal units or vinyl alcohol units. The preferred polyvinyl acetals are polyvinyl butyrals and polyvinyl formals which can be prepared simply or are commercially available. The preferred polyvinyl acetals are the Butvars and Formvar which are commercially available from Monsanto, and the polyvinyl acetals described in U.S. Pat. No. 4,670,507, which is incorporated herein by reference. The most preferred polyvinyl acetal is Mowital B60T, available commercially from Hoechst AG, which contains about 69–71 mol % vinyl acetal units, about 5 mol % vinyl acetate units and about 24–27 mol % vinyl alcohol units.

The starting polymer is reacted with an acid anhydride, preferably an intramolecular anhydride of an organic polycarboxylic acid. The acid anhydride according to the invention is preferably derived from a dicarboxylic or tricarboxylic acid, particularly from a dicarboxylic acid and may have one, two or several rings. Examples of suitable acid anhydrides include maleic anhydride and derivatives thereof, for example, dimethyl maleic anhydride or citraconic anhydride; succinic anhydride and derivatives thereof, for example, methyl succinic anhydride; glutaric anhydride and derivatives thereof, for example, 3-methyl glutaric anhydride, 3,3-tetramethylene glutaric anhydride, or camphoric acid anhydride; 3-oxa-glutaric, anhydride and derivatives thereof; phthalic anhydride and substitution products thereof, for example, chloro, nitro, or carboxyphthalic anhydride, partially or completely hydrogenated phthalic anhydrides, for example, hexahydrophthalic anhydride or cyclohexene-1,2-dicarboxylic acid anhydride; naphthalene-2,3-dicarboxylic acid anhydride or naphthalene-1,8-dicarboxylic acid anhydride and substitution products thereof; pyridine-o-dicarboxylic acid anhydride and substitution products thereof; pyrazine-o-dicarboxylic acid anhydride and substitution products thereof; furan-o-dicarboxylic acid anhydride or furan-2,5-dicarboxylic acid anhydride, the substitution products thereof and the partially or completely hydrogenated derivatives thereof; thiophene-o-dicarboxylic acid anhydride or thiophene-2,5-dicarboxylic acid anhydride, the substitution products thereof and the completely or partially hydrogenated derivatives thereof; dicyclic or polycyclic anhydrides formed by the Diels-Alder reaction of a diene with maleic anhydride, for example, the addition products from furan, anthracene, cyclohexadiene-1,3 or cyclopentadiene with maleic anhydride. The molecular weight of the polymeric component according to the invention can vary within wide limits. Generally, they have average molecular weights in the range of from about between 5,000 to about 200,000 or above, preferably from about 10,000 to about 100,000. The acid numbers of the binders can generally be in the range of from about 5 to about 80, preferably from about 10 to about 70. The acid numbers of the polymers are lower than the acid numbers of the binders which have heretofore been used in photosensitive compositions of the same generic type, as far as these compositions were suitable and intended for the development with aqueous solutions. The reaction between acid anhydride and polymer containing hydroxy groups proceeds very smoothly and is a quantitative reaction in many cases. As a consequence, it is possible to exactly and reproducibly adjust the desired acid number of the binder, for the ultimate application of a particular developer. The reaction is conducted in a suitable solvent such as propylene glycol monomethyl ether. The reaction is conducted in the presence of as tertiary amine catalyst, such as triethylamine. In general, from 0.5 to 20 parts by weight of anhydride, from 1,000 to 3,000 parts by weight of solvent and from 0.5 to 5 parts by weight of tertiary amine are used per 100 parts by weight of polymer containing hydroxy groups. The polymer is optionally isolated by washing with water or dissolving and reprecipitating. U.S. Pat. No. 4,631,245, which is incorporated herein by reference, teaches an anhydride modified polyvinyl acetal polymer which is most useful as the polymeric compound for the dispersion. The polymeric component is preferably present in the overall pigment dispersion composition in an amount of from about 2% to about 20 %, more preferably from about 4% to about 10% and most preferably from about 5% to about 7%. An important feature of the invention is that the pigment and the polymeric compound are present in the dispersion in a weight ratio of from about 0.75:1.25 to about 1.25:0.75.

The colorant dispersion composition then contains a solvent composition which comprises at least one of a $C_1$–$C_8$ aliphatic alcohol, a mono- or di-$C_1$–$C_8$ alkylene glycol $C_1$–$C_8$ alkyl ether, or a cyclic ketone. The most preferred solvents are ethanol, propanol, propylene glycol monomethyl ether, dipropylene glycol methyl ether, ethylene glycol monomethyl ether, diethylene glycol methyl ether, butyrolactone, ethylene glycol monomethyl ether acetate and tetrahydrofuran. It is preferably present in an amount of from about 60% to about 96% by weight of the dispersion composition, more preferably from about 80% to about 92% and most preferably from about 85% to about 90%.

The pigment dispersion is useful in preparing a negative working photosensitive composition which comprises an admixture of at least one light sensitive component which is a diazonium compound or photopolymerizable composition, at least one aqueous alkaline soluble or swellable polymeric binder compound which is the reaction product of a hydroxy containing polymer and an anhydride in the presence of a catalytic amount of a tertiary amine catalyst, and the dispersion in a suitable solvent composition. The ingredients are blended my means well known in the art to form a uniform photosensitive composition. Suitable diazonium compounds are condensation products of aromatic diazonium salts capable of condensation with aldehydes, more particularly condensation products of diphenylamine-4-diazonium salts with formaldehyde, are very highly suitable. Advantageously, co-condensation products are, however, employed which, in addition to the diazonium salt units, contain further, non-photosensitive units which are derived from compounds capable of condensation, for example aromatic amines, phenols, phenol ethers, aromatic thioethers, aromatic hydrocarbons, aromatic heterocyclic compounds or organic acid amides. Such condensation products are disclosed in U.S. Pat. Nos. 3,867,147, 3,679, 419 and 3,849,392. Suitable diazonium salt polycondensation products are condensation products of condensible aromatic diazonium salts, for example, of diphenylamine-4-diazonium salts with aldehydes, preferably formaldehyde. Further particularly advantageous polycondensation products are obtained by condensing an optionally substituted diphenylamine diazonium salt, first with an aromatic compound R'—O—CH2—B and then with an aromatic compound R'—O—CH2—B—CH2—O—R', R' being a hydrogen atom, an alkyl or aliphatic acyl radical and B being the radical of one of the above listed compounds capable of condensation. Suitable polymerizable compounds are, for example, disclosed in U.S. Pat. Nos. 2,760,683 and 3,060, 023. Examples are acrylic or methacrylic acid esters of polyhydric alcohols such as trimethylolpropane triacrylate, polyethylene glycol diacrylate, neopentyl glycol diacrylate, 2,2-dimethylolbutan-3-ol diacrylate, pentaerythritol tri- or tetraacrylate and also the corresponding methacrylates. Furthermore, acrylates or methacrylates which contain urethane groups, and also acrylates or methacrylates of polyesters containing hydroxyl groups are suitable. Finally, prepolymers containing allyl or vinyl groups are suitable, in particular, monomers or oligomers being preferred which contain at least two polymerizable groups per molecule. Numerous substances may be used in the photosensitive mixture according to the invention as photoinitiators. Examples are benzoins, benzoin ethers, polynuclear quinones such as 2 ethylanthraquinone, acridine derivatives such as 9-phenylacridine or benzoacridines, phenazine derivatives such as 9,10-dimethylbenz[a]phenazine, quinoxaline or quinoline derivatives such as 2,3-bis(4-methoxyphenyl) quinoxaline or 2-styrylquinoline, quinazoline compounds or acylphosphine oxide compounds. Useful photoinitiators of this type are, for example, hydrazones, mercapto compounds, pyrylium and thiopyrylium salts, synergistic mixtures with ketones or hydroxyketones and dyestuff redox systems may be suitable. Particularly preferred are photoinitiators which have trihalomethyl groups which can be cleaved by light, in particular suitable compounds from the triazine or thiazoline series. The photoinitiators are in general added in quantitative proportions of about 0.1 to 15, preferably of about 0.5% to 10% by weight, referred to the nonvolatile constituents of the photopolymerizable composition.

The light sensitive component is preferably present in the dried photosensitive composition in an amount of from about 5% to about 50% by weight of the composition, more preferably from about 10% to about 40% and most preferably from about 20% to about 30%. The pigment dispersion is preferably present in the dried photosensitive composition in an amount of from about 10% to about 70% by weight of the composition, more preferably from about 20% to about 60% and most preferably from about 30% to about 50%. The photosensitive composition then contains a polymeric binder, is preferably the same class of compounds as previously described for the polymeric component useful for the pigment dispersion. The polymeric component is preferably present in the dried photosensitive composition in an amount of from about 5% to about 50% by weight of the composition, more preferably from about 10% to about 40% and most preferably from about 20% to about 30%. Such amounts are in addition to the polymeric component present within the dispersion. The photosensitive composition is prepared by admixing the components in a suitable solvent composition in an amount sufficient to form a uniformly blended photosensitive composition. The amount may range from about 80% to about 99% of the overall photosensitive composition. Suitable solvents include those listed above as suitable for preparing the dispersion.

The formed photosensitive composition is applied to a suitable base material and dried in a manner known in the art. Suitable base materials include polymeric films, silicon wafers, and aluminum alloys which have been grained mechanically or electrochemically and optionally anodized and post-treated, aluminum clad films or other hydrophilized films, films coated with copper by vapor deposition or multimetal foils. It is particularly preferred to pretreat the aluminum used for this purpose in the usual manner, for example, by a mechanical, chemical or electrochemical roughening process which is, optionally, followed by an anodic oxidation. A further treatment of this support material, for example, with polyvinyl phosphonic acid, alkali metal silicate, phosphate, hexafluorozirconate, chromate, borate, polyacrylamide and cellulose derivatives is advantageous. The nature of the application depends to a large degree on the desired layer thickness of the photosensitive layer, the layer thicknesses of the photosensitive layer in general being from about 0.5 to about 200 $\mu$m. After drying, the photosensitive composition can be exposed to an image by means of a film mask or, with suitable sensitization, by means of a laser beam and subsequent development. The composition may be exposed under a exposure mask, using light sources which emit light with the highest possible spectral fraction in the near ultraviolet region. The material can also be exposed by laser irradiation. Suitable lasers for irradiation are shorter-wave lasers, for example, Ar lasers, krypton ion lasers, helium/cadmium lasers, emitting in the region between about 300 and 600 nm and, for some coatings, even $CO_2$ lasers, which emit at about 10.6 $\mu$m, or YAG lasers emitting at about 1.06 $\mu$m. Development can be carried out with water, aqueous solutions which optionally contain small quantities of an organic salt and/or surfactants or with aqueous alkali solutions. The type of development preferred in each case depends on the composition of the photosensitive mixture, on the hydroxyl number of the polymer according to the invention and on the application. Those photosensitive mixtures are preferred which can be processed with developers which contain an alkali-metal salt of an aliphatic or araliphatic sulfonic acid, an alkali-metal borate, an alkali-metal phosphate and optionally an alkali-metal salt of an organic aromatic carboxylic acid, for example benzoic acid. Preferred developer solutions are substantially neutral or alkaline aqueous solutions are used, which have a pH value in the range from 6 to 14, preferably from 7.5 to 12, and which contain buffer salts, for example, water-soluble, alkali metal phosphates, silicates, borates, carbonates, acetates or benzoates. Additional constituents used are wetting agents, preferably anionic wetting agents and, if appropriate, water-soluble polymers. The solution can also contain minor amounts, for example, up to 5 percent by weight, preferably not more than 2 percent by weight, or water-miscible organic solvents. It is preferred to use solvents having low volatility, for example, araliphatic alcohols, the vapor pressure of which is of no consequence in the handling of the developer. Development can be performed in the conventional manner by developing machines, dipping, spraying, brushing or wiping-over with a pad. The mixtures according to the invention make it possible to prepare lithographic printing plates which are notable for relatively high print runs, good reproduction properties and storage stability meeting practical requirements. They can be processed easily and without staining using developer solutions which are virtually environmentally neutral.

An important feature of the invention is that the imagewise exposed and developed photographic element has a high contrast between image and the substrate underlying removed non-image areas. The substrates and image areas have a brightness and color which may be measured according to the Hunter Color Space evaluation system and the tristimulus coordinate values which are well known to the skilled artisan. Such may be measured by a Milton Roy Color-Mate Analyzer, available from Milton Roy Co., Rochester, N.Y. In the eye, cone receptors code light to dark, red to green and yellow to blue signals. In the Hunter Space System, the letter "a" denotes redness (positive value) to green (negative value), the letter "b" denotes yellowness (positive value) to blueness (negative value). The lightness variable "L" ranges from 0 for black to 100 for white. The Hunter a, b and L scales establish a translation between the 1931 CIE Standard Observer system and a quantitative system approximating the responses of the human eye-brain combination. The scales produce an opponent-colors system for reproducing visual response to color, regardless of surface interference. Measurement procedures are more fully set forth in ASTM E308-85. Upon producing a photographic image on the substrate, the substrate under the removed non-image areas has a Hunter stimulus lightness value L ranging from about 35 to about 80, preferably from about 50 to about 75 and most preferably from about 65 to about 73. The image areas have an L value of from about 20 to about 60, preferably from about 25 to about 50 and most preferably from about 30 to about 45. The difference between the L value for the substrate under the removed non-image areas and the L value for the image areas is at least about 15 and preferably at least about 20. This invention produces a pigment dispersion using a solvent composition which allows a high pigment to polymeric component loading. When this pigment dispersion is used in the photosensitive composition of this invention, a high L differential is obtained which gives a high contrast photographic element.

The following non-limiting examples serve to illustrate the invention.

EXAMPLE 1 (Comparative)

An aluminum web was roughened by brushing it with a single 24 inch diameter brush rotating at 250 rpm counter to the web direction while using a quartz (silica) slurry with a mean particle size of 25 microns (available from AGSCO, Hasbrouk Heights, N.J.) at 25% solids concentration as the abrasive medium. This substrate had a uniform matte appearance. The grained substrate was etched in sodium hydroxide solution, anodized in sulfuric acid and then sealed using polyvinyl phosphonic acid. The web was coated with a photosensitive coating (a diazo resin which was the polycondensation product of 3-methoxy-4-diazo diphenyl amine sulfate and 4,4'-bismethoxy methyldiphenyl ether, precipitated as mesitylene sulfonate, described in U.S. Pat. No. 4,157,918, and a modified polyvinylacetal resin described in U.S. Pat. No. 4,631,245). The coating formulation is given below:

| INGREDIENT | Weight Percent |
| --- | --- |
| Dowanol PM | 67.478 |
| Butyrolactone (BLO) | 22.493 |
| Resin from U.S. Pat. No. 4,631,245 | 4.300 |
| Phosphoric acid (85%) | 0.198 |
| Phenylazodiphenylamine | 0.075 |
| Diazo from U.S. Pat. No. 4,157,918 | 4.3000 |

The coated slate was exposed to U.V. light (365 nm) through a* negative mask for 30 seconds using a Teaneck exposure unit (sold by Teaneck Graphics Systems, Teaneck, N.J., using a L1250 W light source from Oleck Corporation, Irvine, Calif.). The plates were developed in an aqueous developer (sold under the trade name ND-143 by Hoechst Celanese Corporation, Printing Products Division, Branchburg, N.J.). The sensitivity to the background toning was measured by running imaged plates on a press in a dry scum cycle test using Kohl-Madden red ink on a Heidelberg printing press. The number of sheets needed to print cleanly was determined after application of the dampening rollers. Over 100 copies were run without successfully cleaning out the scummed area.

The L, a and b values for the substrate, and exposed and developed image area were measured using a Hunter calorimeter.

|  | L | a | b |
|---|---|---|---|
| Coated | 44.7 | −18.4 | 5.3 |
| Imaged | 45.3 | −12.3 | −6.6 |
| Substrate | 65.0 | −2.3 | 1.9 |

EXAMPLE 2

An aluminum web was processed as in Example 1 except the slurry was composed of alumina (Grade A12-325 from Alcoa Surface Treatments) with a median particle size of 5 microns. The substrate was lighter matte finish than the material made from Example 1. The aluminum web was coated with the following light sensitive coating:

| Ingredient | Weight Percent |
|---|---|
| Dowanol PM | 46.030 |
| Butyrolactone (BLO) | 13.750 |
| Resin from U.S. Pat. No. 4,631,245 | 1.772 |
| Phosphoric acid (85%) | 0.088 |
| Phenylazodiphenylamine | 0.067 |
| Diazo from U.S. Pat. No. 4,157,918 | 3.835 |
| Blue Dispersion | 34.458 |

The formulation for the blue dispersion is given below:

| Ingredient | Weight Percent |
|---|---|
| Dowanol PM | 66.0 |
| Butyrolactone (BLO) | 22.0 |
| Resin from U.S. Pat. No. 4,631,245 | 6.0 |
| Copper phthalocyanine (Blue B2G) | 6.0 |

The contrast between the surface and the image area was much better than that of Example 1. The L, a and b values for the substrate, and exposed and developed image area were measured using a Hunter colorimeter.

|  | L | a | b |
|---|---|---|---|
| Coated | 30.9 | −25.1 | −5.5 |
| Imaged | 30.9 | −15.9 | −23.3 |
| Substrate | 68.9 | 3.0 | −0.1 |

The image contrast (L-value difference between substrate and image) was 38 units in comparison to 20.3 units for the Example 1 product. The sensitivity to background toning was determined by the method of Example 1. Less than 50 sheets were needed to print clean.

EXAMPLE 3

An aluminum web was processed as in Example 2 and was coated with the following formulation:

| Ingredient | Weight Percent |
|---|---|
| Dowanol PM | 46.030 |
| Butyrolactone (BLO) | 13.750 |
| Resin from U.S. Pat. No. 4,631,245 | 1.772 |
| Phosphoric acid (85%) | 0.088 |
| Phenylazodiphenylamine | 0.067 |
| Diazo from U.S. Pat. No. 4,157,918 | 3.835 |
| Blue Dispersion | 34.458 |

The formulation for the blue dispersion is given below:

| Ingredient | Weight Percent |
|---|---|
| Dowanol PM | 66.0 |
| Butyrolactone (BLO) | 22.0 |
| Resin disclosed in U.S. Pat. No. 4,665,124 | 6.0 |
| Copper phthalocyanine (Blue B2G) | 6.0 |

The sensitivity to background toning was determined by the method of Example 1. Less than 50 sheets were needed to print clean. The difference between the L-values of substrate and image area was 30 units; 10 units better than the control of Example 1.

EXAMPLE 4 (Comparative)

An aluminum web was processed as in Example 1 except the slurry was composed of alumina (Grade A12-325 from Alcoa Surface Treatments) with a median particle size of 5 microns. The substrate was lighter matte finish than the material made from Example 1. The aluminum web was coated with the following light sensitive coating:

| Ingredient | Weight Percent |
|---|---|
| Dowanol PM | 46.030 |
| Butyrolactone (BLO) | 13.750 |
| Resin from U.S. Pat. No. 4,631,245 | 1.772 |
| Phosphoric acid (85%) | 0.088 |
| Phenylazodiphenylamine | 0.067 |
| Diazo from U.S. Pat. No. 4,157,918 | 3.835 |
| Renol Blue B2G | 34.458 |

The formulation for Renol Blue B2G dispersion is given below:

| Ingredient | Weight Percent |
|---|---|
| Dowanol PM | 66.0 |
| Butyrolactone (BLO) | 22.0 |
| Mowital B 3 OH | 6.0 |
| Copper phthalocyanine (Blue B2G) | 6.0 |

The coated plate was exposed and developed with ND-143 developer which is commercially available from Hoechst Celanese Corporation of Somerville, N.J., using the method of Example 1. The plate was not completely developable and exhibited redeposit problems.

EXAMPLE 5

An aluminum web was processed as in Example 1 except the slurry was composed of alumina (Grade A12-325 from Alcoa Surface Treatments) with a median particle size of 5 microns. The substrate was lighter matte finish than the material made from Example 1. The aluminum web was coated with the following light sensitive coating:

| Ingredient | Weight Percent |
| --- | --- |
| Dowanol PM | 52.030 |
| Butyrolactone (BLO) | 16.750 |
| Resin from U.S. Pat. No. 4,631,245 | 2.772 |
| Phosphoric acid (85%) | 0.088 |
| Phenylazodiphenylamine | 0.067 |
| Diazo from U.S. Pat. No. 4,157,918 | 3.835 |
| Blue Dispersion | 25.458 |

The contrast between the surface and the image area was better than that of Example 1 (25 units). The sensitivity to background toning was determined by the method of Example 1. Less than 50 sheets were needed to print clean.

EXAMPLE 6

An aluminum web was processed as in Example 1 except the slurry was composed of alumina (Grade A12-325 from Alcoa Surface Treatments) with a median particle size of 5 microns. The substrate was lighter matte finish than the material made from Example 1. The aluminum web was coated with the following light sensitive coating:

| Ingredient | Weight Percent |
| --- | --- |
| Dowanol PM | 46.030 |
| Butyrolactone (BLO) | 13.750 |
| Resin from U.S. Pat. No. 4,631,245 | 1.772 |
| Phosphoric acid (85%) | 0.088 |
| Phenylazodiphenylamine | 0.067 |
| Diazo from U.S. Pat. No. 4,157,918 | 3.835 |
| Red Dispersion | 34.458 |

The formulation for the red dispersion is given below:

| Ingredient | Weight Percent |
| --- | --- |
| Dowanol PM | 66.0 |
| Butyrolactone (BLO) | 22.0 |
| Resin from U.S. Pat. No. 4,631,245 | 6.0 |
| Permanent Carmine FBB-02 Magenta pigment | 6.0 |

The contrast between the surface and the image area was better than that of Example 1 (25 units). The sensitivity to background toning was determined by the method of Example 1. Less than 50 sheets were needed to print clean.

What is claimed is:

1. An imagewise exposed and developed photographic element having high contrast between image and removed non-image areas which comprises
   (a) a substrate; and
   (b) a photographic image on the substrate, which image has been produced by coating and drying a photosensitive composition on the substrate, imagewise exposing the photosensitive composition to actinic radiation and removing the non-image areas of the photosensitive compositiun to thereby uncover portions of the substrate underlaying the non-image areas while not removing the image areas; wherein the substrate under the removed non-image areas has a Hunter stimulus lightness value L ranging from about 35 to about 80, the images areas have an L value of from about 20 to about 60 and the difference between the L value for the substrate under the removed non-image areas and the L value for the image areas is at least about 15; wherein said photosensitive composition comprises an admixture of at least one light sensitive component diazonium compound or photopolymerizable composition, in an amount sufficient to form a uniform photosensitive composition; at least one aqueous alkaline soluble or swellable polymeric binder compound which is the reaction product of a hydroxy containing polymer and an anhydride in the presence of a catalytic amount of a tertiary amine catalyst, which binder is present in an amount sufficient to bind the photosensitive composition in a uniform admixture; and a colorant dispersion in an amount sufficient to uniformly color the photosensitive composition; said colorant dispersion comprising:
   i. at least one pigment;
   ii. a solvent composition which comprises at least one of a $C_1$–$C_8$ aliphatic alcohol, a mono- or di-$C_1$–$C_8$ alkylene glycol $C_1$–$C_8$ alkyl ether, or a cyclic ketone; and
   iii. at least one aqueous alkaline soluble or swellable polymeric compound which is the reaction product of a hydroxy containing polymer and all anhydride in the presence of a catalytic amount of a tertiary amine catalyst,
   wherein the pigment and the polymeric compound are present in a weight ratio of from about 0.75:1.25 to about 1.25:0.75 and wherein the solvent composition is present in an amount sufficient to form a uniform, stable dispersion.

2. The photographic element of claim 1 herein the substrate comprises one or more materials selected from the group consisting of aluminum alloys, silicon and polymeric materials.

3. A colorant dispersion which comprises in admixture
   (a) at least one pigment;
   (b) a solvent composition which comprises at least one of a $C_1$–$C_8$ aliphatic alcohol, a mono- or di-$C_1$–$C_8$ alkylene glycol $C_1$–$C_8$ alkyl ether, or a cyclic ketone; and
   (c) at least one aqueous alkaline soluble or swellable polymeric compound which is the reaction product of a hydroxy containing polymer and an anhydride in the presence of a catalytic amount of a tertiary amine catalyst;
   wherein the pigment and the polymeric compound are present in a weight ratio of from about 0.75:1.25 to about 1.25:0.75 and wherein the solvent composition is present in an amount sufficient to form a uniform, stable dispersion.

4. The photographic element of claim 1 wherein the polymeric compound of the colorant dispersion is the reaction product of an intramolecular anhydride of an organic polycarboxylic acid and a synthetic polymer containing vinyl alcohol units and having no further functional groups capable of reaction with acid anhydrides.

5. The photographic element of claim 1 wherein the polymeric compound of the colorant dispersion has an average molecular weight of from about 5,000 to about 200,000, and an acid number of from about 5 to about 80.

6. The photographic element of claim 1 wherein the hydroxy containing polymer of the colorant dispersion is selected from the group consisting of one or more of epoxy resins, saponified epoxy resins, copolymers of unsaturated alcohols, polyhydroxyalkyl acrylates and polyhydroxyalkyl methacrylates.

7. The photographic element of claim 1 wherein the hydroxy containing polymer of the colorant dispersion has vinyl alcohol moieties.

8. The photographic element of claim 1 wherein the hydroxy containing polymer of the colorant dispersion is a copolymer of vinyl acetal, vinyl alcohol and vinyl acetate.

9. The photographic element of claim 1 wherein the hydroxy containing polymer of the colorant dispersion is a polyvinyl butyral or polyvinyl formal.

10. The photographic element of claim 1 wherein the hydroxy containing polymer of the colorant dispersion is a polyvinyl butyral which contains about 69–71 mol % vinyl acetal units, about 5 mol % vinyl acetate units and about 24–27 mol % vinyl alcohol units.

11. The photographic element of claim 1 wherein the anhydride of the colorant dispersion is an intramolecular anhydride of an organic polycarboxylic acid.

12. The photographic element of claim 1 wherein the hydroxy containing polymer is a polyvinyl butyral which contains about 69–71 mol % vinyl acetal units, about 5 mol % vinyl acetate units and about 24–27 mol % vinyl alcohol units, the anhydride is maleic anhydride and the catalyst is triethylamine.

13. The photographic element of claim 1 wherein the pigment is present in an amount of from about 2% to about 20% by weight, the solvent composition is present in an amount of from about 60% to about 96% by weight and the polymeric compound is present in an amount of from about 2% to about 20% by weight.

14. The photographic element of claim 1 wherein the solvent composition comprises one or more of ethylene glycol monomethyl ether, butyrolactone, propylene glycol monomethyl ether, ethylene glycol monomethyl ether acetate and tetrahydrofuran.

15. A method of producing an imagewise exposed and developed photographic element having high contrast between image and removed non-image areas which comprises i) forming a colorant dispersion which comprises in admixture
(a) at least one pigment;
(b) a solvent composition which comprises at least one of a $C_1$–$C_8$ aliphatic alcohol, a mono- or di-$C_1$–$C_8$ alkylene glycol $C_1$–$C_8$ alkyl ether, or a cyclic ketone; and
(c) at least one aqueous alkaline soluble or swellable polymeric compound which is the reaction product of a hydroxy containing polymer and an anhydride in the presence of a catalytic amount of a tertiary amine catalyst;
wherein the pigment and the polymeric compound are present in a weight ratio of from about 0.75:1.25 to about 1.25:0.75 and wherein the solvent composition is present in an amount sufficient to form a uniform, stable dispersion;

ii) forming a negative working photosensitive composition which comprises an admixture of at least one light sensitive component diazonium compound or photopolymerizable composition, in an amount sufficient to form a uniform photosensitive composition; at least one aqueous alkaline soluble or swellable polymeric binder compound which is the reaction product of a hydroxy containing polymer and an anhydride in the presence of a catalytic amount of a tertiary amine catalyst, which binder is present in an amount sufficient to bind the photosensitive composition in a uniform admixture; and the colorant dispersion in an amount sufficient to uniformly color the photosensitive composition;

iii) coating the photosensive composition onto a substrate and drying;

iv) imagewise exposing the photosensitive composition to actinic radiation; and v) removing the nonimage areas of the photosensitive composition from the substrate while leaving the image areas of the photosensitive composition on the substrate;

wherein the substrate under the removed non-image areas has a Hunter stimulus lightness value L ranging ranging from about 35 to about 80, the image areas have an L value of from about 20 to about 60 and the difference between the L value for the substrate under the removed non-image areas and the L value for the image areas is at least about 20.

16. The method of claim 15 wherein the substrate comprises one or more materials selected from the group consisting of aluminum alloys, silicon and polymeric materials.

* * * * *